United States Patent
Honkawa et al.

(10) Patent No.: US 7,145,930 B2
(45) Date of Patent: *Dec. 5, 2006

(54) SEMICONDUCTOR LASER DEVICE AND METHOD FOR FABRICATING THE SAME

(75) Inventors: Yukio Honkawa, Tokyo (JP); Takahiro Ono, Tokyo (JP); Satoshi Hattori, Tokyo (JP); Yoshihiro Sato, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 245 days.

This patent is subject to a terminal disclaimer.

(21) Appl. No.: 10/867,731

(22) Filed: Jun. 16, 2004

(65) Prior Publication Data

US 2005/0002431 A1    Jan. 6, 2005

Related U.S. Application Data (63) Continuation of application No. 09/997,306, filed on Nov. 28, 2001, now Pat. No. 6,768,759.

(30) Foreign Application Priority Data

Nov. 30, 2000 (JP) ............... 2000-364387
Nov. 27, 2001 (JP) ............... 2001-360940

(51) Int. Cl.
*H01S 5/00* (2006.01)
(52) U.S. Cl. .................. 372/46.01; 372/45.01
(58) Field of Classification Search ............. 372/43.01, 372/46.01, 45.01
See application file for complete search history.

(56) References Cited

U.S. PATENT DOCUMENTS 5,345,464 A * 9/1994 Takemoto .............. 372/46.014
5,390,205 A * 2/1995 Mori et al. .............. 372/46.01
5,666,455 A * 9/1997 Aoki et al. .................. 385/131

FOREIGN PATENT DOCUMENTS

JP    08-288589    11/1996

OTHER PUBLICATIONS

T. Ohtoshi, et al., "Analysis of Current Leakage in InGaAsP/InP Buried Heterostructure Laser," IEEE Journal of Quantum Electronics, vol. 25, No. 6, Jun. 1989, pp. 1369-1375.

* cited by examiner

*Primary Examiner*—Minsun Oh Harvey
*Assistant Examiner*—Tuan N. Nguyen
(74) *Attorney, Agent, or Firm*—Oblon, Spivak, McClelland, Maier & Neustadt, P.C.

(57) ABSTRACT

A method for fabricating a buried semiconductor laser device including the steps of: forming a mesa structure including a bottom cladding layer, an active layer and a top cladding layer overlying an n-type semiconductor substrate; and forming a current confinement structure by growing a p-type current blocking layer and an n-type current blocking layer on each side surface of the mesa structure and on a skirt portion extending from the each side surface, the p-type current blocking layer being fabricated by using a raw material gas containing a group III element gas and a group V element gas at a molar ratio between 60 and 350 inclusive. In this method, the semiconductor laser device including the current confinement structure with the specified leakage current path width can be fabricated with the excellent reproducibility.

6 Claims, 9 Drawing Sheets

SEMICONDUCTOR LASER DEVICE AND METHOD FOR FABRICATING THE SAME

RELATED APPLICATIONS

The present application is a continuation of U.S. patent application Ser. No. 09/997,306, filed on Nov. 28, 2001, now U.S. Pat. No. 6,768,759 and claims benefit of priority under 35 U.S.C. §119 to the following Japanese Patent Application Nos. 2000-364387 (filed on Nov. 30, 2000) and 2001-360940 (filed on Nov. 27, 2001), each of which are incorporated herein by reference.

BACKGROUND OF THE INVENTION (a) Field of the Invention

The present invention relates to a semiconductor laser device and a method for fabricating the same, and more particularly to a so-called buried semiconductor laser device having a higher laser emission efficiency and a higher reproducibility of a current-optical output characteristic.

(b) Description of the Related Art

A semiconductor laser device having a lower threshold current density and a higher laser emission efficiency is desirable. A strained quantum well semiconductor laser device having a hetero-structure and a pair of current blocking layers is attracting public attention because of the excellent characteristics thereof. The semiconductor laser having a pair of current blocking layers in abutment to the semiconductor laser structure is generally called a buried semiconductor laser.

A conventional strained quantum well semiconductor laser device shown in JP-A-8(1996)-288589 will be described referring to FIG. 1A.

Figure 1A:
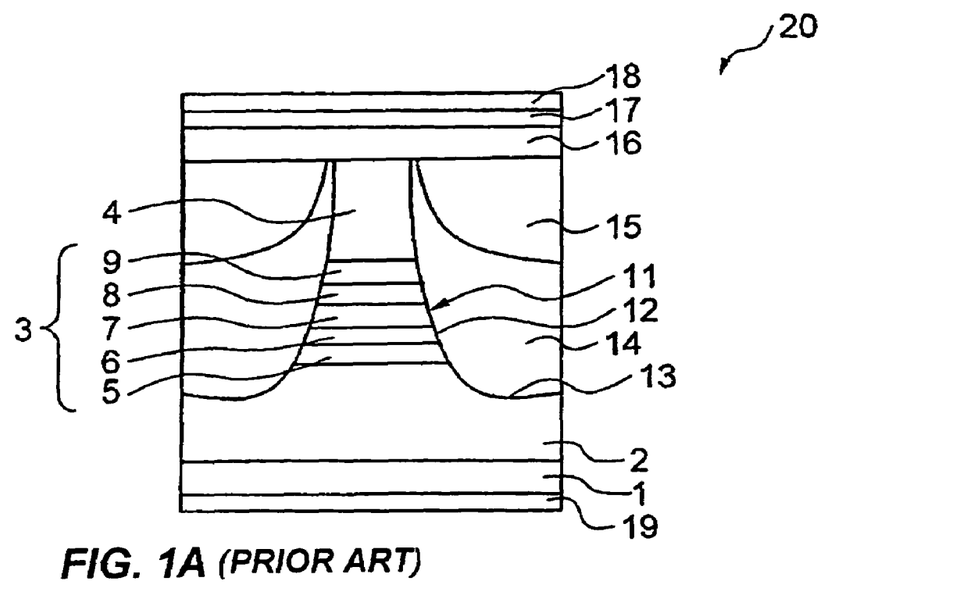
FIG. 1A is an idealized schematic sectional view of a conventional buried semiconductor laser device according to the prior art.

As shown in idealized form in FIG. 1A, a conventional strained quantum-well semiconductor laser device 20 includes a layer structure having an n-type InGaP bottom cladding layer 2, an active layer 3, and a p-type InGaP top cladding layer 4, sequentially and epitaxially grown on an n-type GaAs substrate 1 by using a metal organic chemical vapor deposition (MOCVD) method.

The active layer 3 is a five-layered structure including an InGaAsP layer 5, a GaAs layer 6, an InGaAs layer 7, a GaAs layer 8 and an InGaAsP layer 9.

The top cladding layer 4, the active layer 3 and the top part of the bottom cladding layer 2 are configured to have a mesa structure 11. Each of the side surfaces 12 of the mesa structure 11 and the adjacent surfaces of the bottom cladding layer 2 are covered with a p-type InGaP current blocking layer 14 and an n-type InGaP current blocking layer 15, which are sequentially deposited.

A second p-type InGaP top cladding layer 16 and a p-type contact layer 17 are sequentially deposited on the n-type InGaP current blocking layer 15, the p-type InGaP current blocking layer 14 and the top cladding layer 4 of the mesa structure 11.

A p-side metal electrode layer 18 and an n-side metal electrode layer 19 are deposited on the top surface of the p-type contact layer 17 and the bottom surface of the substrate 1, respectively.

Figure 1B:
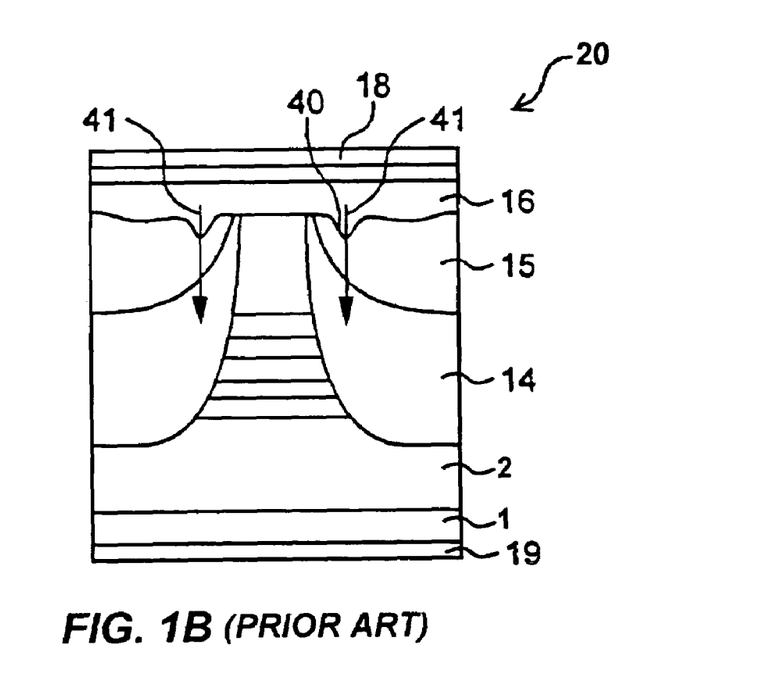
FIG. 1B is a sectional view of a buried semiconductor laser device according to the prior art showing where hollows and crystal dislocations commonly occur with fabrication method of the prior art.

The above publication points out a problem when the p-type current blocking layer 14 and the n-type current blocking layer 15 are grown by using an etching mask. Referring to FIG. 1B, structural defects such as hollows and grooves 40 are formed on the n-type current blocking layer 15 along the bottom surface of the etching mask due to the difference between the growth rates.

When the hollows 40 on the n-type current blocking layer 15 are large, crystal dislocations are liable to occur along the lines 41 shown in FIG. 1B. The propagation of a crystal dislocation from a point within layer 15 to a point within the p-type contact layer 17 increases the threshold current of the fabricated laser device, which lowers the laser emission efficiency.

The above publication describes the growth conditions of the p-type and n-type current blocking layers 14, 15 such that the substrate temperature is between 750° C. and 800° C. and a mixing ratio (concentration ratio) of a group V element gas with respect to a group III element gas is between 400:1 and 800:1 inclusive (V: III), thereby suppressing the occurrence of the structural defects (e.g., hollows) to decrease the probability and magnitude of the crystal dislocations. (As used later herein, we will abbreviate the conventional notation for the V:III chemical ratios from 400:1 to simply read as "400," which means the molar amount of the group V element gas divided by the molar amount of group III element gas).

Since the disappearance of the structural defects thickens the n-type current blocking layer 15 in the vertical direction formed overlying the substrate 1, the amount of leakage current flowing through the current blocking layers 14, 15 is decreased, which in turn increases the laser emission efficiency when a voltage is applied between the electrodes 18, 19.

Further, Mitsubishi Denki Giho (Mitsubishi Electric Advance) Vol. 67, No. 8 (1993), p. 88 points out a decrease of the laser emission efficiency due to a leakage current which does not contribute to the laser emission and which flows along the interface between the mesa structure and the current blocking layer.

The buried semiconductor laser device with the reduced leakage current includes higher laser emission efficiency, good linearities of the higher output characteristic, and an excellent current-voltage characteristic. Accordingly, when the leakage current path width is reduced, the resistance of the current blocking layer increases to provide desirable laser characteristics.

Even when the current blocking layer is formed under the conditions described in the former publication such that the substrate temperature is between 750° C. and 800° C., and the mixing ratio between the group V element gas and the group III element gas is between 400 and 800, the leakage current path width is quite difficult to be formed in a narrower manner with the excellent reproducibility, and the values of the widths are difficult to be regulated and controlled.

Similarly, in the fabrication of the buried semiconductor laser device formed on the p-type substrate, an n-type InP contact layer is excessively grown to be in contact with an n-type InP contact layer, and a leakage current path width is increased.

As a result, the increased leakage current lowers the laser emission efficiency to worsen the output characteristic and the linearity of the current-voltage characteristic, and the buried semiconductor laser device with the higher output can be hardly fabricated with the excellent reproducibility.

SUMMARY OF THE INVENTION

The present invention encompasses buried semiconductor laser devices and methods of manufacturing the same. An exemplary general method according to the present invention comprising forming a mesa structure including a bottom cladding layer, an active layer and a top cladding layer overlying a semiconductor substrate. The mesa structure has at least one side surface extending from the top surface of the mesa toward the bottom cladding layer, with the active layer having an exposed side thereat. The mesa structure also has a skirt surface extending outward from each side surface to cover a portion of the substrate's surface. The exemplary general method further comprising growing a first current-confinement layer on the mesa's at least one side surface, with the first current-confinement layer comprising a semiconductor material and having a first conductivity type (e.g., p-type or n-type). A second current-confinement layer is then grown above at least a portion of the first current-confinement layer, the second current-confinement layer comprising a semiconductor material and having a second conductivity type which is opposite to the first conductivity type. The closest spacing distance between the second current-confinement layer and the active layer defines a "leakage current path width" (e.g., Tn or Tp). This spacing distance is normally shown in a cross-sectional plane which is perpendicular to the top surface of the substrate, and which is oriented to provide the smallest width of the mesa. The first confinement layer is grown at a temperature ranging from 610° C. to 700° C. using a raw material gas comprising a group V element gas and a group III element gas at a molar ratio of the group V element gas with respect to the group III element gas having a value between 50 and 500, inclusive, to provide a value of the leakage current path width ranging from 0.15 µm to 0.60 µm.

As used herein, the term "group V element gas" is defined as including any precursor gas comprised of molecules, each molecule of the precursor gas comprising one or more atoms of an element listed in the fifth column of the Periodic Table. The term "group III element gas" is defined as including any precursor gas comprised of molecules, each molecule of the precursor gas comprising one or more atoms of an element listed in the third column of the Periodic Table. A raw material gas may also comprise precursor gases which carry dopant atoms (e.g., elements in the fourth and sixth columns of the Periodic Table). A group V element gas may comprise two or more different precursor gases (each carrying atoms in the fifth column of the Periodic Table), such the combination of a Phosphorous carrying precursor gas and an Arsenic carrying precursor gas. Likewise, a group III element gas may comprise two or more different precursor gases (each carrying atoms in the third column of the Periodic Table), such the combination of an Indium carrying precursor gas and an Gallium carrying precursor gas.

In one exemplary implementation of the present invention (generally described below under "Embodiment 1"), a buried semiconductor laser device is fabricated using the steps of: forming a mesa structure including a bottom cladding layer, an active layer and a top cladding layer overlying an n-type semiconductor substrate; and forming a current confinement structure by growing a p-type current blocking layer (first current confinement layer) and an n-type current blocking layer (second current confinement layer) on each side surface of the mesa structure and preferably on each skirt portion extending from each corresponding side surface. The p-type current blocking layer is fabricated by using a raw material gas comprising a group V element gas and a group III element gas at a molar ratio of the group V element gas with respect to the group III element gas between 50 and 500 inclusive to provide a value of the leakage current path width ranging from 0.15 µm to 0.60 µm.

In another exemplary implementation of the present invention (generally described below under "Embodiment 2"), a buried semiconductor laser device is fabricated using the steps of: forming a mesa structure including a bottom cladding layer, an active layer and a top cladding layer overlying a p-type semiconductor substrate; and forming a current confinement structure by growing a p-type separation layer (first current confinement layer), an n-type current blocking layer (second current confinement layer), and a p-type current blocking layer (third current confinement layer) on each side surface of the mesa structure and on preferably on each skirt portion extending from each corresponding side surface. The p-type separation layer is fabricated by using a raw material gas comprising a group V element gas and a group III element gas at a molar ratio of the group V element gas with respect to the group III element gas between 50 and 500 inclusive, to provide a value of the leakage current path width ranging from 0.15 µm to 0.60 µm.

In accordance with the present invention, the suitable selection of the molar ratio of the group V element gas with respect to the group III element gas suppresses the structural defects such as the hollows and the trenches on the surface of the buried layer, and the buried semiconductor laser device including the current confinement structure having the specified leakage current path width can be fabricated with excellent reproducibility and higher yield.

The buried semiconductor laser device according to the present invention also has larger laser emission efficiency, reduced leakage current, higher optical output, excellent linearity (lack of kinks) of the output characteristic with respect to driving current, and good linearity of the current-voltage characteristic in the lasing region of device operation.

The above and other objects, features and advantages of the present invention will be more apparent from the following description.

PREFERRED EMBODIMENTS OF THE INVENTION

Figure 3A:
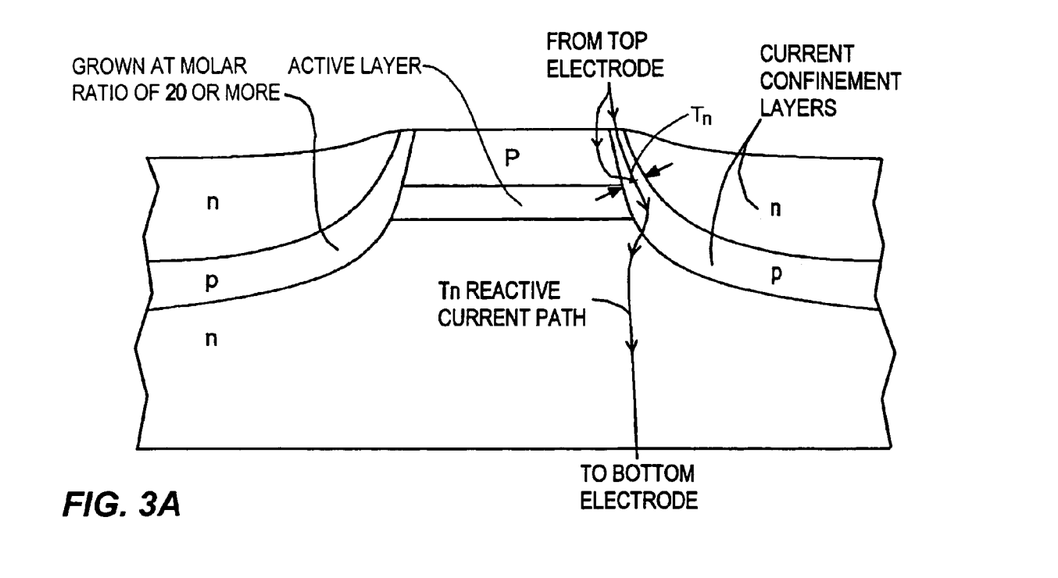
FIGS. 3A and 3B are schematic sectional views of exemplary current confinement structures (Embodiment 1 and Embodiment 2, respectively) according to the present invention.
Figure 3B:
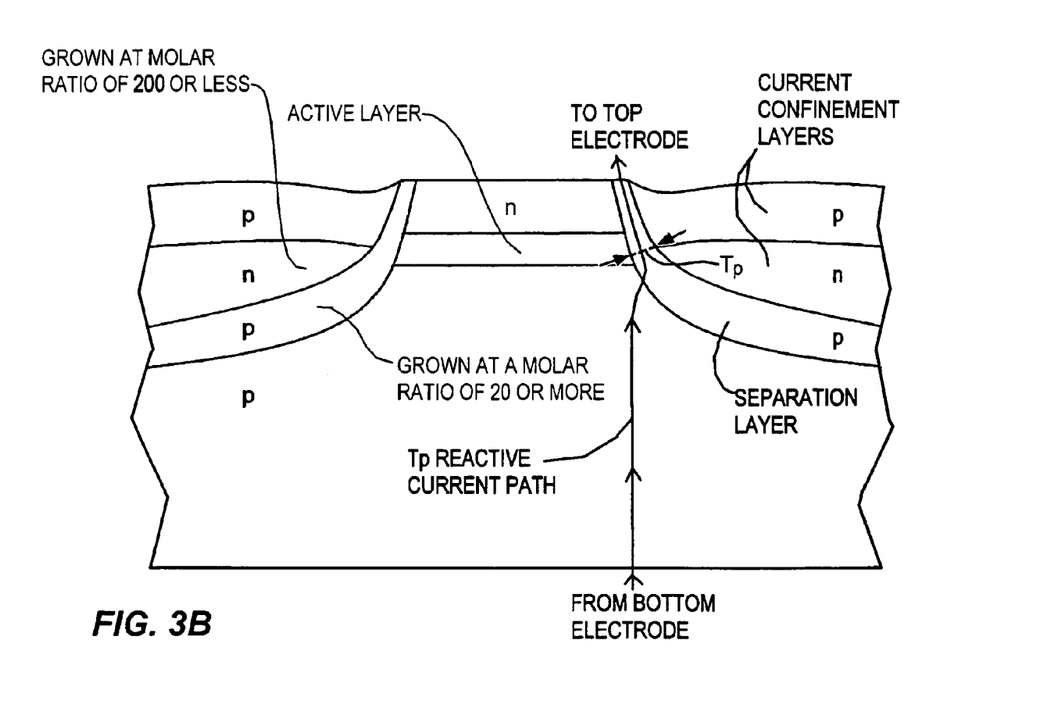

Referring first to FIGS. 3A and 3B, the inventors define the leakage current path widths for two basic types of buried semiconductor laser devices, herein referred to as "Embodiment 1" and "Embodiment 2". FIG. 3A shows a buried semiconductor device which is built upon an n-type substrate and which has two-layer current-confinement structure disposed on either side of a light-guiding mesa ridge (Embodiment 1). The mesa ridge has an n-type bottom cladding layer formed over the n-type substrate, an active layer formed over the bottom cladding layer, and a p-type top cladding layer formed over the active layer. The active layer generally comprises two or more sub-layers. When a voltage is applied between the top and bottom electrodes of the laser to place the device in an operating (lasing) state, a leakage current path is formed between the top and bottom electrodes which allows current to flow around the active layers. The path is indicated in FIG. 3A as the "Tn Leakage Current Path." This current originates from the top electrode, flows substantially vertically through the p-type blocking layer along the side face of the buried ridge, bypassing around the active layers, and terminates into the n-type cladding layer below the active layers, as shown in FIG. 3A. We define the effective path width Tn of this leakage current path as being the shortest distance between the side face of the active layers and the outer current blocking layer, which is the n-type current blocking layer. The distance Tn is a measure of the effective cross-sectional width through which the leakage (i.e., parasitic) current flows. With a lasing voltage applied, the amount of leakage current increases with the value of width Tn.

FIG. 3B shows a buried semiconductor device which is built upon a p-type substrate and which has a three-layer current-confinement structure disposed on either side of a light-guiding mesa ridge (Embodiment 2). The mesa ridge has a p-type bottom cladding layer formed over the p-type substrate, an active layer formed over the bottom cladding layer, and an n-type top cladding layer formed over the active layer. The active layer generally comprises two or more sub-layers. The current confinement structure comprises a p-type separation layer formed over the p-type substrate and p-type bottom cladding layer, an n-type current blocking layer formed over the p-type separation layer, and a p-type current blocking layer formed over the n-type current blocking layer. When a voltage is applied between the top and bottom electrodes of the laser to place the device in an operating (lasing) state, a leakage current path is formed between the top and bottom electrodes which allows current to flow around the active layers. The path is indicated in FIG. 3B as the "Tp Leakage Current Path." This current originates from the bottom electrode, flows through the substrate to the p-type separation layer along the side face of the buried ridge, bypassing around the active layers, and terminating into a second upper n-type cladding layer (not shown in FIG. 3B). This second upper n-cladding layer is formed above the top current confinement layer and the top cladding layer, both of which are shown in FIG. 3. The leakage current has to pass through a constricted region located between the side face of active layer and the n-type current blocking layer. We define the effective path width Tp of this leakage current path as being the cross-sectional width of this constricted region, which is substantially equal to the shortest distance between the side face of the active layer and the n-type current blocking layer. The distance Tp is a measure of the effective cross-sectional width through which the leakage (i.e., parasitic) current flows. With a lasing voltage applied, the amount of leakage current increases with the value of width Tp.

Based on a number of experiments conducted by the present inventors, the present inventors have discovered that, during the fabrication of the buried semiconductor laser device on an n-type substrate (Embodiment 1), the leakage current path width Tn varies with, and can be controlled by, the molar ratio of a group V element gas with respect to a group III element gas contained in a raw material gas used to form the p-type current blocking layer. The present inventors have further discovered that, during the fabrication of the buried semiconductor laser device on a p-type substrate (Embodiment 2), the leakage current path width Tp varies with, and can be controlled by, the molar ratios used to form the p-type separation layer and the n-type current blocking layer. The present inventors have further discovered the most suitable leakage current path widths Tn and Tp, and the molar ratios for realizing the most suitable widths Tn and Tp, as described in greater detail below.

Before proceeding to the Experimental Sets, the inventors wish to define some terms used herein. As is known in the art, "n-type" and "p-type" are conductivity types of a semiconductor substrate or layer. As is known in the art, a "n-type" semiconductor substrate or layer is formed when the number of n-type dopant atoms exceeds the number of p-type atoms in the substrate or layer. A "p-type" semiconductor substrate or layer is formed when the number of p-type dopant atoms exceeds the number of n-type atoms in the substrate or layer. Normally, one does not deliberately add both p-type and n-type dopant atoms to the same substrate or layer, since the existences of both types of dopants tends to lower the mobility of the charge-carrying carriers (e.g, holes and electrons). In addition, it is known in the art to refer to n-type and p-type materials as being opposites of one another, since they support carriers of opposite charge.

In addition, the inventors have divided each side of the mesa structure into two sections: a side surface which extends from the top of the mesa down to a dividing line which lies below the active layer and usually well into the bottom cladding layer, and a skirt surface which extends from this dividing line to the flat section of the substrate's top surface. Although not necessary, one may set the dividing line at the point where the slope of the surface makes a 45-degree angle with respect to the flat surface of the substrate. In any case, the side surface of the mesa reaches down to at least a portion of the active layer (preferably all or a substantial portion of the active layer) such that the active layer has at least one side which is exposed at the side face.

Finally, all of the growth temperatures described herein and indicated in the claims are measured at the growth surface of the substrate. This temperature may be different from the temperature at the back surface (non-growth surface) of the substrate.

Experiment Set #1

In this Experiment Set, the variation of the leakage current path width Tn in the laser structure of FIG. 3A (Embodiment 1) was measured while the molar ratios of the group V element gas with respect to the group III element gas were changed. The study of these variations were conducted at the following five MOCVD growth temperatures: 610° C., 640° C., 650° C., 670° C., and 700° C., as measured at the surface of the substrate where the epitaxial growth is occurring. The results are shown in a graph of FIG. 2A.

Figure 2A:
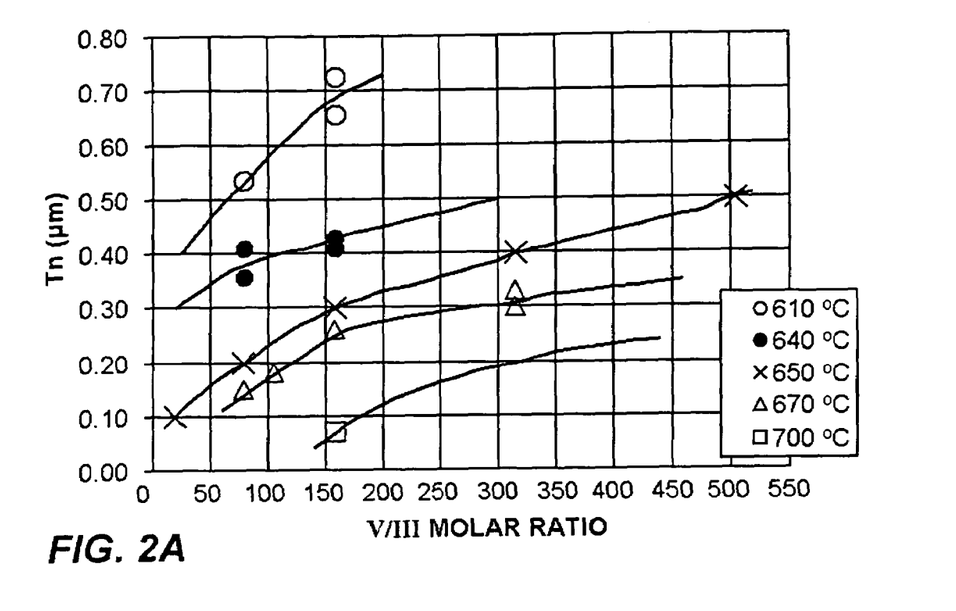
FIGS. 2A–2C are graphs showing various relations between molar ratios of raw material gases, growth temperatures, and the leakage current path width "Tn" at selected epitaxial growth temperatures according to the present invention.

As shown therein, the leakage current path width Tn is regulated (i.e., controlled) at each growth temperature by the molar ratio of the group V element gas with respect to the group III element for forming the p-type current blocking layer. The value of Tn increases as the molar ratio increases, for each of the growth temperatures studied.

When the molar ratio of the group V element to the group III element is changed, the inventors have found that the distance and the period of time in which one element (for example, the group III element) of the two elements combines with the other element (for example, the group V element) and moves on the mesa structure to form the film is varied. Increasing the molar ratio reduces the migration distance of the two elements and promotes the crawling-up of the current blocking layer along the side faces of mesa ridge structure, which in turn increases the leakage current path width Tn. Reducing the molar ratio increases the migration distance of the two elements, which suppresses the crawling-up of the current blocking layer, and thereby reduces the leakage current path width. Accordingly, the degree of the crawling-up of the p-type current blocking layer along the mesa ridge structure of the device of FIG. 3A can be changed. This same behavior occurs during the formation of the p-type separation layer formed on the mesa ridge structure of the device shown in FIG. 3B, and for growing the n-type current blocking layers since the presence of minute quantities of dopant atoms (either p-type or n-type), does not substantially affect the migration process of the principal semiconductor atoms used to form the layers.

As a practical example, when the space around the mesa structure overlying the n-substrate is filled for the device of FIG. 3A (Embodiment 2), the supply molar ratio is adjusted to be 20 or more to freely change the leakage current path width Tn, thereby forming a preferable buried structure, as shown in FIG. 3A.

As another practical example, when the space around the mesa structure overlying the p-substrate is filled for the device of FIG. 3B (Embodiment 2), the supply molar ratios for forming the p-type separation layer (first layer) and for forming the n-type current blocking layer (second layer) are adjusted be to 20 or more and 200 or less, respectively, thereby forming a preferable buried structure, as shown in FIG. 3B.

In summary, a larger molar ratio reduces the migration distance and promotes the crawling-up of the current blocking layer (FIG. 3A) or the separation layer (FIG. 3B) along the mesa ridge structure, thereby increasing the leakage current path width. On the other hand, a smaller molar ratio increases the migration distance and suppresses the crawling-up of the layer, thereby reducing the leakage current path width.

While the results shown in FIG. 2A are for the width Tn in the device of FIG. 3A, it is expected that the results for the width Tp in the device of FIG. 3B as a function of molar ratio will be substantially the same as those shown in FIG. 2A. The smaller number of studies that the inventors have conducted on the structure of FIG. 3B have provided results for Tp as a function of molar ratio and growth temperature which are substantially the same as the results for Tn.

Figure 2B:
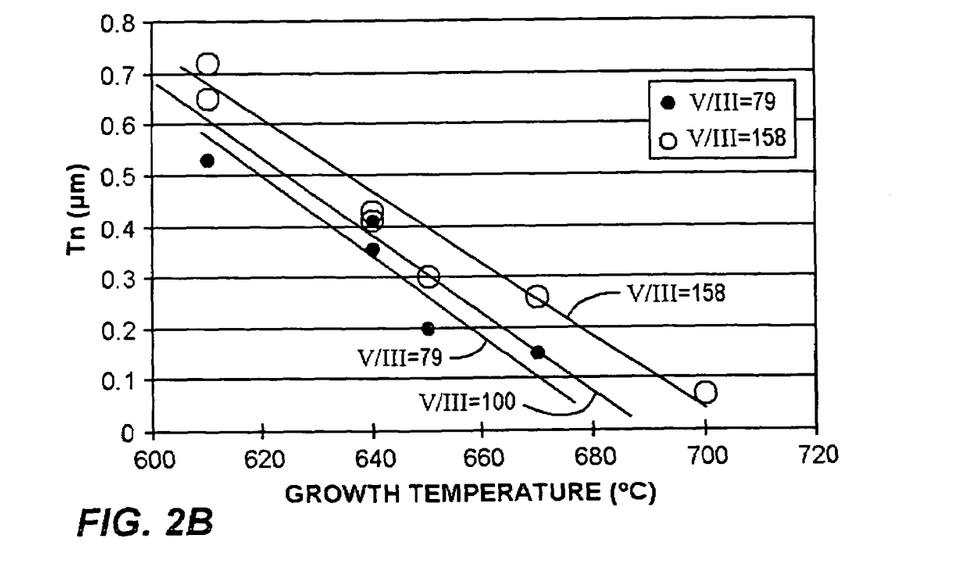

Selected data points in FIG. 2A have been re-plotted in FIG. 2B to show the dependence of Tn upon growth temperature for two selected values of molar ratio (79 and 158). The results generally show a linear behavior. The figure includes a line for the molar ratio 100, which is based on other data points and the interpolated of the data obtained at the molar rations of 79 and 158. The same results are expected for Tp. The studies that the inventors have conducted on the structure of FIG. 3B have provided results for Tp as a function of molar ratio and growth temperature which are substantially the same as the results for Tn.

In addition, the data of FIG. 2A has been used to construct curves of constant Tn (and Tp) plotted in the two-dimensional domain of growth temperature and molar ratio. Shown are eight curves of constant Tn (and Tp) at 0.15 µm, 0.20 µm, 0.25 µm, 0.30 µm, 0.35 µm, 0.40 µm, 0.50 µm, and 0.60 µm. These curves are contained within the sub-domain which ranges from 610° C. to 700° C. in growth temperature (T), and 50 to 500 in V/III molar ratio (MR). The curve at 0.60 µm spans from MR=110 at T=610° C. to MR=500 at T=640° C. The curve may be mathematically described as MR=(13.0·T−7,820), and equivalently as T=(MR+7,820)/13.0. This curve forms the upper bound of MR for growth temperatures between 610° C. and 640° C. The remainder of the upper bound of MR for growth temperatures between 640° C. and 700° C. is set at 500. At the other extreme, the curve at 0.15 µm spans from MR=50 at T=650° C. to MR=95 at T=680° C. The curve may be mathematically described as MR=(1.5·T−925), and equivalently as T=(MR+925)/1.5. This curve forms the lower bound of MR for growth temperatures between 650° C. and 680° C. An additional part of the lower bound of MR is formed by a constant value of MR=50 for growth temperatures between 640° C. and 650° C., and the relationship MR=(0.833·T−483) for growth temperatures between 610° C. and 640° C., the latter relationship being mathematically equivalent to T=(MR+483)/0.833. The remainder of the lower bound of MR is formed by a segment of the Tn=0.20 µm curve, which is described below in greater detail.

The Tn,Tp=0.50 µm curve has a first segment which spans from MR=60 at T=610° C. to MR=300 at T=640° C., and a second segment which spans from the latter point to MR=500 at T=650° C. The first segment of this curve may be mathematically described as MR=(8.0·T−4,820), and equivalently as T=(MR+4,820)/8. The second segment of this curve may be mathematically described as MR=(20.0·T−12,500), and equivalently as T=(MR+12,500)/20.

The Tn,Tp=0.40 µm curve has a first segment which spans from MR=25 at T=610° C. to MR=100 at T=640° C., and a second segment which spans from the latter point to MR=320 at T=650° C. The first segment of this curve may be mathematically described as MR=(2.5·T−1,500), and equivalently as T=(MR+1,500)/2.5. The second segment of this curve may be mathematically described as MR=(22.0·T−13,980), and equivalently as T=(MR+13,980)/22.

The Tn,Tp=0.35 µm curve has a first segment which spans from MR=50 at T=640° C. to MR=240 at T=650° C., and a second segment which spans from the latter point to MR=460 at T=670° C. The first segment of this curve may be mathematically described as MR=(19.0·T−12,110), and equivalently as T=(MR+12,110)/19. The second segment of this curve may be mathematically described as MR=(110·T−6,910), and equivalently as T=(MR+6,910)/11.

The Tn,Tp=0.30 µm curve spans from MR=160 at T=650° C. to MR=260 at T=670° C. The curve may be mathematically described as MR=(5.0·T−3,090), and equivalently as T=(MR+3,090)/5.

The Tn,Tp=0.25 µm curve spans from MR=120 at T=650° C. to MR=160 at T=670° C. The curve may be mathematically described as MR=(2.0·T−1,180), and equivalently as T=(MR+1,180)/2.

The Tn,Tp=0.20 µm curve has a first segment which spans from MR=80 at T=650° C. to MR=120 at T=670° C., and a second segment which spans from the latter point to MR=320 at T=700° C. The first segment of this curve may be mathematically described as MR=(2.0·T−1,220), and equivalently as T=(MR+1,220)/2. The second segment of this curve may be mathematically described as MR= (6.67·T−4,349), and equivalently as T=(MR+4,349)/6.67. The second segment forms the lower bound of MR for temperatures between 680° C. and 700° C.

For ready reference, Table I below lists the values of MR at the endpoints of the segments for the above curves.

TABLE I

| MR | | Tn, Tp (μm) | | | | | | | |
|---|---|---|---|---|---|---|---|---|---|
|  |  | 0.15 | 0.20 | 0.25 | 0.30 | 0.35 | 0.40 | 0.50 | 0.60 |
| GROWTH TEMP (° C.) | 610 |  |  |  |  |  | 25 | 60 | 110 |
|  | 640 |  |  |  |  | 50 | 100 | 300 | 500 |
|  | 650 | 50 | 80 | 120 | 160 | 240 | 320 | 500 |  |
|  | 670 | 80 | 120 | 160 | 260 | 460 |  |  |  |
|  | 680 | 95 |  |  |  |  |  |  |  |
|  | 700 |  | 320 |  |  |  |  |  |  |

Experimental Set #2

Figure 2C:
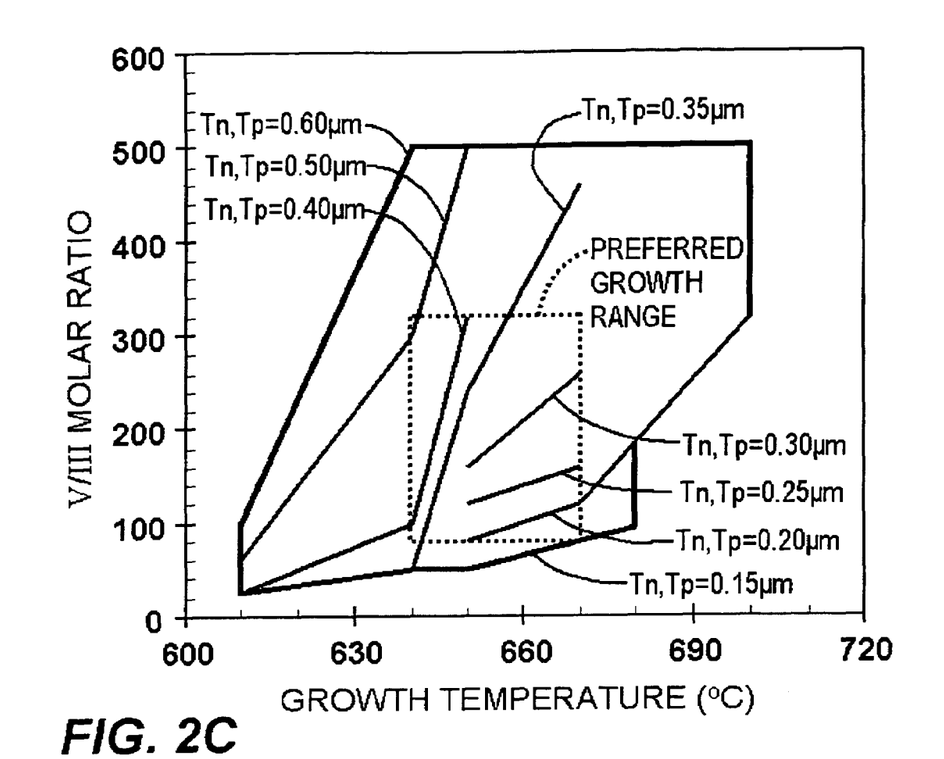
Figure 4:
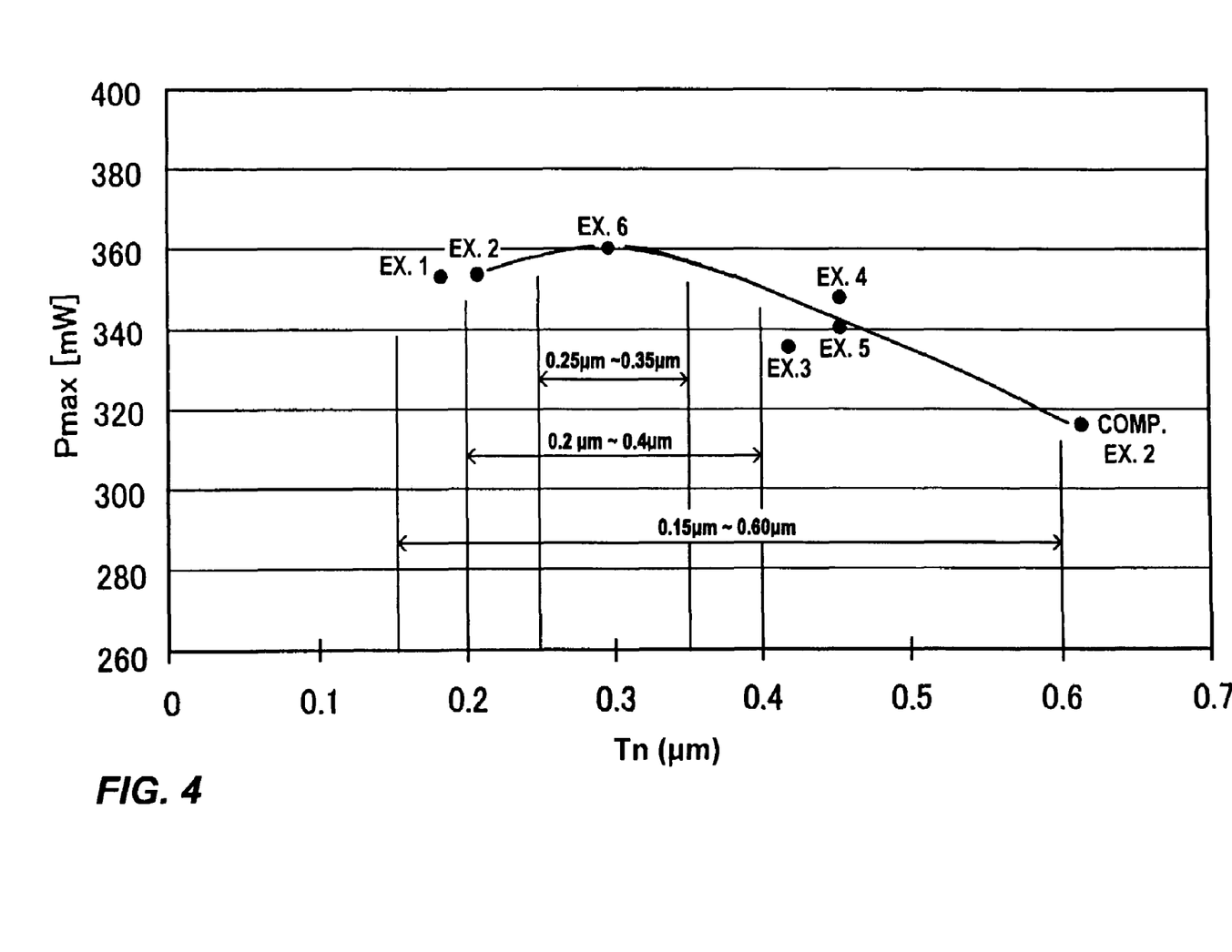
FIG. 4 is a graph of maximum optical output power as a function of several device examples which have different values of the leakage current path width "Tn", according to the present invention.

In this Example, the relationship between the leakage current path width Tn for the device shown in FIG. 3A (Embodiment 1) and the laser output power was studied by constructing a number of seven example lasers with different values of the leakage current path width Tn and measuring the resulting peak output power. The cavity length of each example laser was the same, at a value of 1300 μm, and the construction of the example laser is described near the end of the text. The results are shown in FIG. 4. A peak output power level of 360 mW was obtained at a value of Tn approximately equal to 0.30 μm. From interpolation of the data, values of Tn from 0.25 μm to 0.35 μm are expected to provide output power level that are within 2% of the peak value, and values of Tn from 0.2 μm to 0.4 μm are expected to provide output power level that are within 5% of the peak value. Accordingly, preferred embodiments grow the first current-confinement layer with values of T and MR which lie at or between the curves for 0.20 μm and 0.40 μm in FIG. 2C. These curve generally encompass a preferred growth region as indicated in FIG. 2C, which spans growth temperatures from 640° C. to 670° C. and molar ratios (MR) from 80 to 320. Further preferred embodiments grow the first current-confinement layer with values of T and MR which lie at or between the curves for 0.25 μm and 0.35 μm in FIG. 2C.

Selection of Molar Ratios

As can be seen from FIG. 2A, to achieve a value of Tn in this range at a growth temperature of 650° C., the molar ratio used for forming the p-type current blocking layer overlying the n-substrate in the device shown in FIG. 3A (Embodiment 1) should be adjusted to be between 50 and 500, inclusive. When the molar ratio is below 50 at this growth temperature, the reproducibility of forming the current confinement structure having the specified leakage current path width Tn is deteriorated, and molar ratios below 50 at this temperature do not regulate or control the leakage current path widths very well. On the other hand, when the molar ratio exceeds 500 at this growth temperature, the leakage current path width Tn is increased to a value of over 0.5 μm, thereby providing a large leakage current. In more preferred embodiments of the device shown in FIG. 3A, a value for Tn in the range from 0.2 μm to 0.4 μm is used to further reduce the leakage current. This range can be achieved at a growth temperature of 650° C. with a molar ratio between 80 and 320, inclusive, for forming the p-type current blocking layer. In further preferred embodiments, Tn is set in the range from 0.25 μm to 0.35 μm, which can be achieved at a growth rate of 650° C. with a molar ratio between 120 and 240, inclusive.

The n-type current blocking layer in the device shown in FIG. 3A is preferably grown at a growth temperature and molar ratio which provides the same or larger degree of creep up the mesa ridge than that used in growing the p-type current blocking layer. Referring to FIG. 2C, this corresponds to selecting a growth temperature (T) and molar ratio (MR) which lie on a Tn,Tp curve which has a larger value than that used to grow the p-type current blocking (confinement) layer. Accordingly, when the n-type current blocking ratio is grown at the same temperature as the p-type current blocking layer, the same or larger molar ratio is preferably used for forming the n-type current blocking layer. Alternatively, when the n-type current blocking layer is grown with the same molar ratio as the p-type current blocking layer, the same or lower growth temperature is preferably used for forming the n-type current blocking layer. Thereby, the growth rate from the side of the mesa structure becomes larger during the formation of the n-type current blocking layer, which suppresses the formation of structural defects, such as hollows, trenches, and crystal dislocations.

Similarly, to achieve a value of Tp in the range from 0.15 μm to 0.6 μm at a growth temperature of 650° C. for the device of FIG. 3B (Embodiment 2), the molar ratio used for forming the p-type separation layer overlying the p-substrate should be adjusted to be between 50 and 500, inclusive. When the molar ratio is below 50 at this growth temperature, the reproducibility of the current confinement structure becomes poor, and the value of leakage current path width Tp is not controlled very well. On the other hand, when the molar ratio exceeds 500 at this growth temperature, the leakage current path width Tp is increased to a value of over 0.5 μm, thereby providing a large leakage current. In more preferred embodiments of the device shown in FIG. 3B, a value for Tp in the range from 0.2 μm to 0.4 μm is used to further reduce the leakage current. This range can be achieved at a growth temperature of 650° C. with a molar ratio between 80 and 320, inclusive, for forming the p-type separation layer. In further preferred embodiments, Tp is set in the range from 0.25 μm to 0.35 μm, which can be achieved at a growth rate of 650° C. with a molar ratio between 120 and 240, inclusive.

The n-type current blocking layer of the device in FIG. 3B is then grown over the p-type separation layer, preferably at a growth temperature and molar ratio which provides less creep up the mesa ridge than that achieved in growing the p-type separation layer. Referring to FIG. 2C, this corresponds to selecting a growth temperature (T) and molar ratio (MR) which lie on a Tn,Tp curve which has a smaller value than that used to grow the p-type separation layer. Accordingly, when the n-type current blocking ratio is grown at the same temperature as the p-type separation layer, a lower molar ratio is preferably used for forming the n-type current blocking layer. Alternatively, when the n-type current blocking layer is grown with the same molar ratio as the p-type separation layer, a higher growth temperature is preferably used for forming the n-type current blocking layer. At an exemplary growth temperature of 650° C., the molar ratio for forming the n-type current blocking layer is preferably between 30 and 80, inclusive. When this molar ratio is below 30, structural defects are formed firstly on the surface of the n-type current blocking layer and then on the surface of the p-type current blocking layer that is subsequently formed. At the other extreme, when the molar ratio is larger than 80, the n-type current blocking layer grows not only from the top surface of the skirt of the mesa structure but also from the side surface thereof such that the n-type current blocking layer makes contact with the n-type top cladding layer of the mesa ridge structure, or with the n-type contact layer which is formed at a later step. The contacting of the n-type current blocking layer with either or both of these other n-type layers is undesirable because it creates another leakage current path.

The p-type current blocking layer of the device in FIG. 3B (Embodiment 2) is preferably grown at a growth temperature and molar ratio which provides the same or larger degree of creep up the mesa ridge than that used in growing the n-type current blocking layer. Accordingly, when the p-type current blocking ratio is grown at the same temperature as the n-type current blocking layer, the same or larger molar ratio is preferably used for forming the p-type current blocking layer. Alternatively, when the p-type current blocking layer is grown with the same molar ratio as the n-type current blocking layer, the same or lower growth temperature is preferably used for forming the p-type current blocking layer. Thereby, the growth rate of the p-type current blocking layer from the side surface of the mesa structure becomes larger to suppress the structural defects.

The methods according to the present invention (as exemplified in FIGS. 3A and 3B, respectively) can be applied without limitation to any configuration including the semiconductor substrate, the bottom cladding layer, the active layer, the top cladding layer and the current blocking layer. In addition, the shape of the mesa structure is not restricted so long as the mesa structure is the buried one.

The buried semiconductor laser device formed on the n-type or the p-type substrate in accordance with the present invention has the reduced leakage current and includes the current confinement structure having substantially no structural defects. Accordingly, the buried semiconductor laser device with the higher output can be fabricated with excellent reproducibility and/or higher yield having the better output characteristics such as the threshold current and the emission efficiency, and with good linearity of the current-voltage characteristic in the lasing regime.

In the semiconductor laser devices formed on the p-type substrate and the n-type substrate in accordance with the present invention, the leakage current path widths Tp and Tn have the following ranges of values:

$0.15\ \mu m < Tp < 0.6\ \mu m$ $0.15\ \mu m < Tn < 0.6\ \mu m.$

The more preferred range of values is:

$0.2\ \mu m \leq Tp \leq 0.4\ \mu m$ $0.2\ \mu m \leq Tn \leq 0.4\ \mu m,$ and the most preferred range of values is:

$0.25\ \mu m \leq Tp \leq 0.35\ \mu m$ $0.25\ \mu m \leq Tn \leq 0.35\ \mu m.$

These ranges realize the buried semiconductor laser device having the above excellent characteristics.

The configuration of a buried semiconductor laser device in accordance with embodiments of the present invention will now be described referring to the annexed drawings.

Examples of the Two-Layer Current Confinement Structure (FIG. 3A)

We first describe the general structure of the example devices used to generate the data points shown in FIG. 4, and thereafter more fully describe devices in detail. These devices use the structure shown in FIG. 3A (Embodiment 1).

Figure 5A:
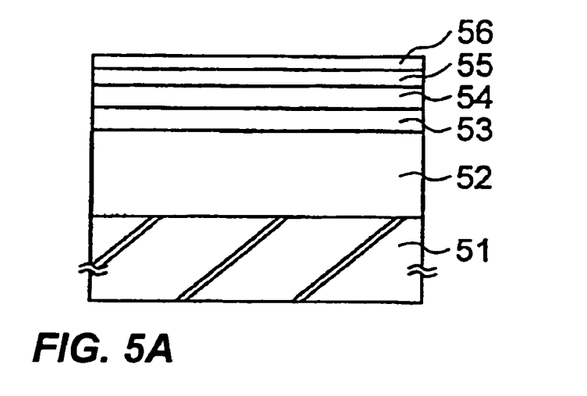
FIGS. 5A to 5D are vertical sectional views sequentially showing a method for fabricating the buried semiconductor laser device of Embodiment 1.

As shown in FIG. 5A, a multi-layer structure including an n-type InP bottom cladding layer 52, a bottom GRIN-SCH layer 53, an active layer 54 having a strained multiple quantum well structure, a top GRIN-SCH layer 55 and a p-type LIP top cladding layer 56 sequentially deposited is formed on an n-type InP substrate 51 by the MOCVD method using conventional epitaxial growth conditions for growing these mesa layers.

Figure 5B:
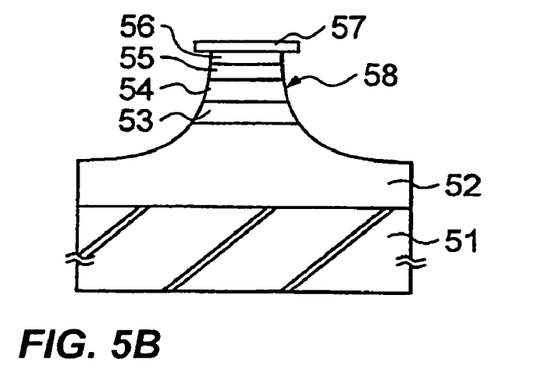

Then, as shown in FIG. 5B, an etching mask 57 formed by a silicon nitride ($SiN_X$) film is deposited on the top cladding layer 56, and, by using the etching mask 57, the top cladding layer 56, the top GRIN-SCH layer 55, the active layer 54, the bottom GRIN-SCH layer 53 and the top of the bottom cladding layer 52 in the multi-layered structure are etched with an etching solution 57, thereby forming a mesa structure 58 having the undercut on the bottom surface of the etching mask 57.

Figure 5C:
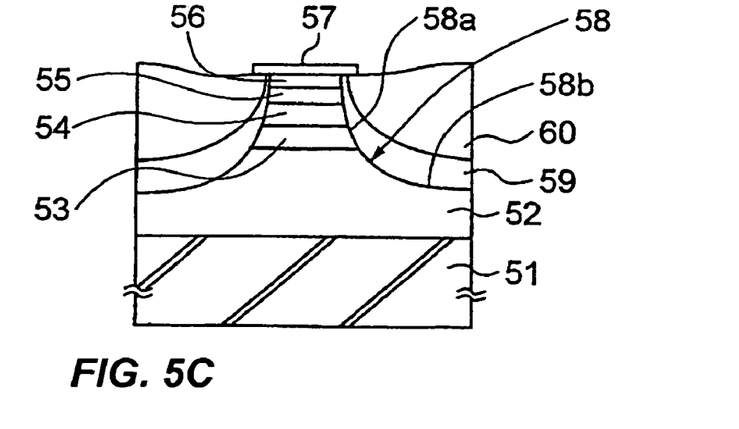

Then, as shown in FIG. 5C, a p-type InP current blocking layer 59 having a thickness of 1 μm is deposited on the side surface 58a and the top skirt surface 58b of the mesa structure 58 by using the MOCVD method at a growth temperature of 650° C. A raw material gas used therein contains a group V element gas and a group III element gas in a molar ratio (V/III) between 50 and 500, inclusive. The space around the mesa structure 58 is further filled by subsequently depositing an n-type InP current blocking layer 60 having a thickness of 1 μm to 2 μm on the p-type InP current blocking layer 59 at the molar ratio larger than that used for forming the p-type InP current blocking layer 59. The growth temperature is maintained substantially at 650° C.

As an example, trimethylindium (TMIn), phosphine ($PH_3$) and diethylzinc (DEZn) may be used as the group III element gas, the group V element gas and a doping gas, respectively, for forming the p-type InP current blocking layer 59; the same group III and V element gases as those for forming the p-type InP current blocking layer 59 and hydrogen sulfide ($H_2S$) as the doping gas may be used for forming the n-type InP current blocking layer 60.

Figure 5D:
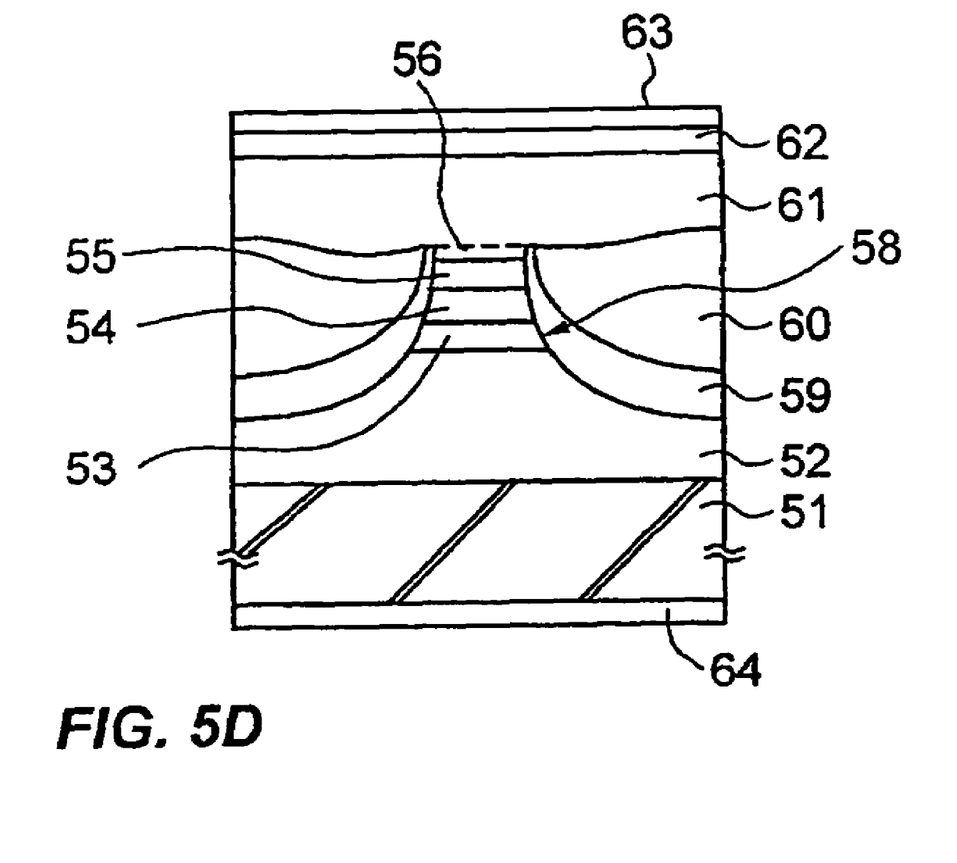

Next, as shown in FIG. 5D, a p-type InP top cladding layer 61 and a p-type GaInAsP cap layer 62 are sequentially formed on the mesa structure 58 and the current blocking layers 59, 60 by using the MOCVD method.

After the formation of a p-side electrode 63 on the p-type GaInAsP cap layer 62, the bottom surface of the n-type InP substrate 51 is polished to control the total thickness of the substrate to about 0.1 mm (100 µm), and an n-side electrode 64 is formed on the polished surface.

EXAMPLE 1

Example 1 uses the above fabrication steps with the p-type InP current blocking layer 59 and the n-type InP current blocking layer 60 being formed at the growth temperature of 650° C. and at the molar ratios of 80 and 158, respectively, for filling the space around the mesa structure 58. After the top cladding layer 61 and the cap layer 62 were sequentially formed, the two electrodes 63, 64 were formed thereon and on the bottom surface of the substrate 51. Then, the obtained structure was cleaved, a low reflection film and a high reflection film were formed on respective ones of the cleaved surfaces, thereby fabricating a semiconductor laser device of Example 1 having an emission wavelength range from 1.28 µm to 1.63 µm.

As shown in Table 2, the leakage current path width "Tn" observed with an electron microscope was 0.19 µm.

TABLE 2

| | Conductivity of Substrate | Growth Temp. | Molar Ratio of p-type Current Blocking Layer | Molar Ratio of n-type Current Blocking Layer | Leakage Current Path Width "Tn" (µm) |
| --- | --- | --- | --- | --- | --- |
| Example 1 | n | 650° C. | 80 | 158 | 0.19 |
| Example 2 | n | 650° C. | 80 | 158 | 0.21 |
| Example 3 | n | 650° C. | 316 | 158 | 0.41 |
| Example 4 | n | 650° C. | 316 | 158 | 0.45 |
| Example 5 | n | 650° C. | 316 | 158 | 0.45 |
| Example 6 | n | 650° C. | 158 | 158 | 0.30 (highest output) |
| Comp. Example 1 | n | 650° C. | 20 | 158 | 0.10 |
| Comp. Example 2 | n | 610° C. | 158 | 158 | 0.65 |

EXAMPLES 2 AND 3

Buried semiconductor laser devices of Examples 2 and 3 having the emission wavelength range from 1.28 µm to 1.63 µm were fabricated by using the same conditions as those of Example 1 except that the molar ratios of the raw material gas for 0.15 forming the p-type InP current blocking layer 59 and the n-type InP current blocking layer 60 were shown in Table 2, which were different from those of Example 1. The leakage current path widths "Tn" thereof were 0.21 µm and 0.41 µm, respectively, as shown in Table 2.

EXAMPLES 4 AND 5

Buried semiconductor laser devices of Examples 4 and 5 having the emission wavelength range from 1.28 µm to 1.63 µm were fabricated by using the same conditions as those of Example 1 except that the molar ratios of the raw material gas for forming the p-type InP current blocking layer 59 and the n-type InP current blocking layer 60 were 316 and 158, respectively. The leakage current path width "Tn" of each device was 0.45 µm. The devices did, however, have slightly different output power levels (350 mW versus 340 mW), which can be due variations in the cavity lengths and the reflectivities of the reflection films formed on the laser facets.

EXAMPLE 6

Buried semiconductor laser devices of Example 6 having an emission wavelength in the range of 1.28 µm to 1.63 µm was fabricated by using the same conditions as those of Example 1 except that the molar ratios of the raw material gas for forming the p-type InP current blocking layer 59 and the n-type InP current blocking layer 60 were-each set at 158. The leakage current path width "Tn" of the device was 0.30 µm. This device had the highest output power level (360 mW) of the constructed devices.

COMPARATIVE EXAMPLES 1 AND 2

For the purpose of evaluating the fabrication methods of Examples 1 to 6, buried semiconductor laser devices of Comparative Examples 1 and 2 having the emission wavelength range from 1.28 µm to 1.63 µm were fabricated by using the same conditions as those of Example 1 except that the molar ratios of the raw material gas for forming the p-type InP current blocking layer 59 and the n-type InP current blocking layer 60 were as shown in Table 2, which were out of the range specified in the present invention. The leakage current path widths "Tn" thereof were 0.10 µm and 0.65 µm, respectively, as shown in Table 2.

In the buried semiconductor laser devices of Examples 1 to 6, the leakage current path widths "Tn" were controlled in the range from 0.19 µm to 0.45 µm to have smaller leakage current.

On the other hand, in the buried semiconductor laser device of Comparative Example 1, the leakage current path width "Tn" was 0.10 µm which was too small, and the reproducibility of the leakage current characteristic was too poor to be quantified because the molar ratio for forming the p-type current blocking layer is smaller than that prescribed in the first invention. On the other hand, in the buried semiconductor laser device of Comparative Example 2, the leakage current path width "Tn" was 0.60 µm, which was large enough to generate a larger leakage current.

Exemplary Construction of the Three-Layer Current Confinement Structure (FIG. 3B)

Figure 6A:
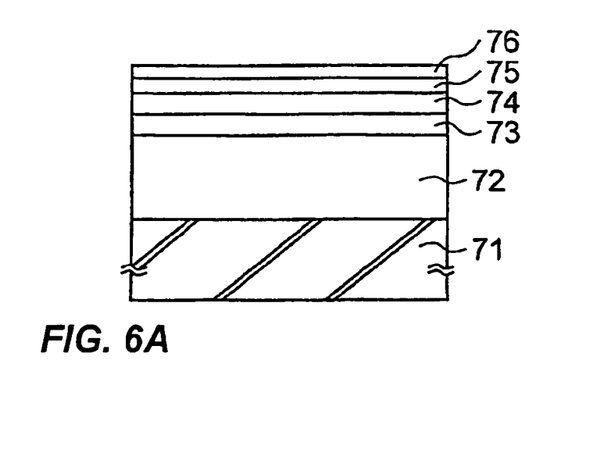
FIGS. 6A to 6D are vertical sectional views sequentially showing a method for fabricating the buried semiconductor laser device of Embodiment 2.

As shown in FIG. 6A, a multi-layered film is formed including a p-type InP bottom cladding layer 72, a bottom GRIN-SCH layer 73, an active layer 74 having a strained multiple quantum well structure, a top GRIN-SCH layer 75 and an n-type InP top cladding layer 76 sequentially formed on a p-type InP substrate 71 by using the MOCVD method using conventional epitaxial growth conditions for growing these mesa layers.

Figure 6B:
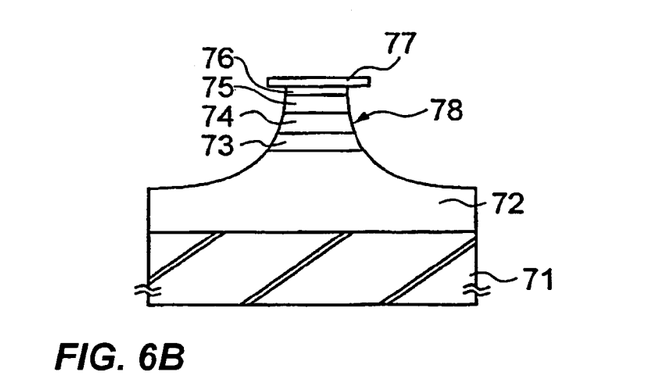

After an etching mask 77 made of a silicon oxide film is formed on the top cladding layer 76 as shown in FIG. 6B, the top cladding layer 76, the top GRIN-SCH layer 75, the active layer 74, the bottom GRIN-SCH layer 73 and the top portion of the bottom cladding layer 72 are etched with an etching solution by using the etching mask 77, thereby forming a mesa structure 78 having the undercut on the bottom surface of the etching mask 77.

Figure 6C:
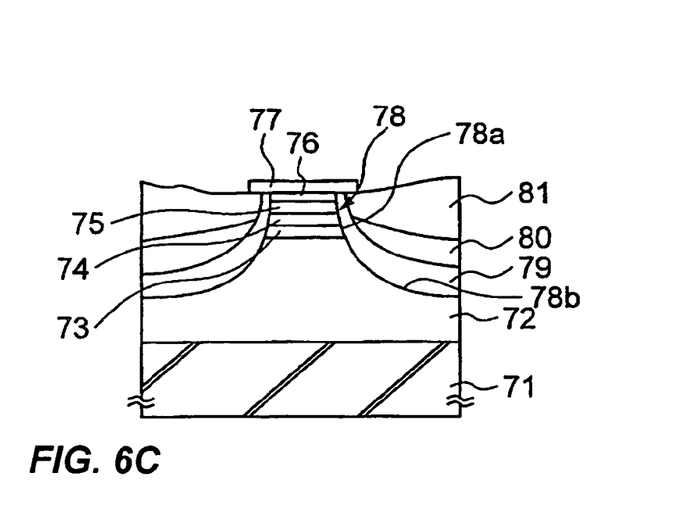

Then, as shown in FIG. 6C, a p-type InP separation layer 79 is deposited on the side surface 78a and the top skirt surface 78b of the mesa structure 78 by using the MOCVD method by using a raw material gas containing a group V element gas and a group III element gas in a molar ratio (V/III) between 50 and 500 inclusive. Further, an n-type InP current blocking layer 80 and a p-type InP current blocking layer 81 are formed by using raw material gases having molar ratios (V/III) between 30 and 80 inclusive and between 50 and 500 inclusive, respectively, to fill the space around the mesa structure 78.

For example, trimethylindium (TMIn), phosphine ($PH_3$) and diethylzinc (DEZn) may be used as the group III element gas, the group V element gas and a doping gas, respectively, for forming the p-type InP separation layer 79 and the p-type current blocking layer 81.

For example, the same group III and V element gases as those for forming the p-type InP separation layer 79 and the p-type current blocking layer 81, and hydrogen sulfide ($H_2S$) as the doping gas may be used for forming the n-type InP current blocking layer 80.

Figure 6D:
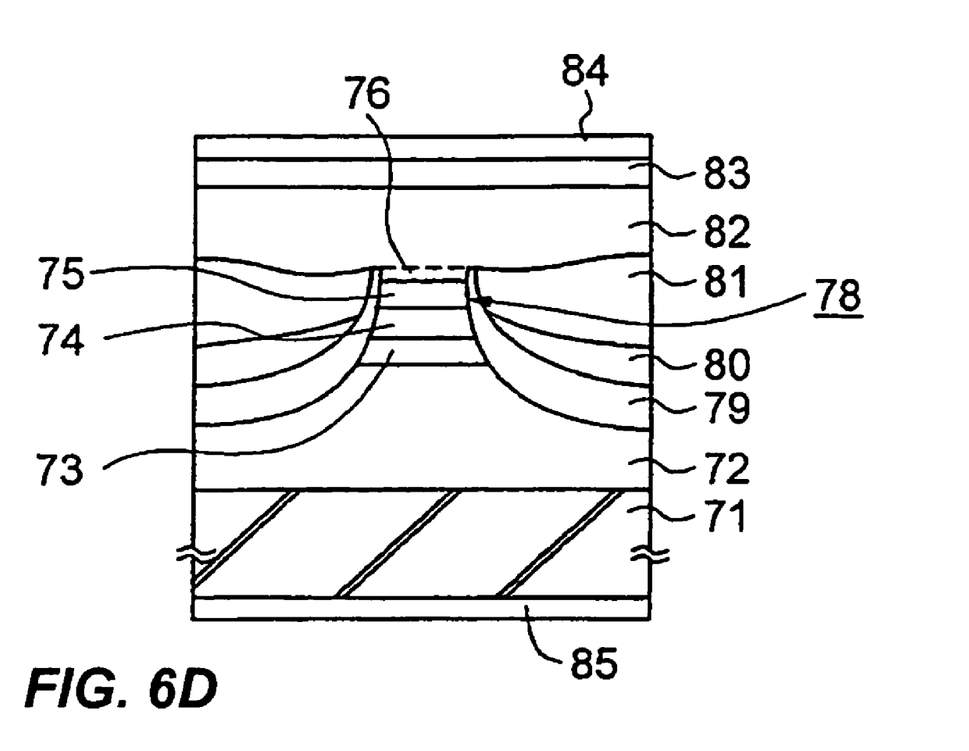

Then, as shown in FIG. 6D, an n-type InP top cladding layer 82 and an n-type GaInAsP cap layer 83 are sequentially formed on the mesa structure 78, the p-type separation layer 79 and the current blocking layer 81 by using the MOCVD method.

After the formation of an n-side electrode 84 on the n-type GaInAsP cap layer 83, the bottom surface of the n-type InP substrate 71 is polished to control the total thickness of the substrate to about 0.1 µm, and a p-side electrode 85 is formed on the polished surface.

As mentioned above, the dependence of the width Tp on the molar ratio and growth temperature for the device of FIG. 3B is expected to be substantially the same as the dependence of the width Tn on molar ratio and growth temperature for the device of FIG. 3A since the degree of crawl up is not substantially affected by the minute quantities of dopant atoms (either p-type or n-type). The studies that the inventors have conducted on the structure of FIG. 3B have provided results for Tp as a function of molar ratio and growth temperature which are substantially the same as the results for Tn.

GENERAL DEFINITION OF MOLAR RATIO

The precursor gases used today to construct III–V semiconductor devices contain group III and group V atoms in mono-atomic form. That is to say that each molecule of a precursor gas only has one atom from the third column of the periodic table, or only one atom from the fifth column of the periodic table. Thus, in this case, to compute the molar quantity of the group V element gas, one multiplies the molar quantity of each group V precursor gas by 1, and sums the quantities together. In a similar manner, to compute the molar quantity of the group III element gas, one multiplies the molar quantity of each group III precursor gas by 1, and sums the quantities together. The molar ratio is then the division of the two summed quantities.

In the event that the industry develops multi-atomic forms of precursor gases (that is, two or more group V atoms per molecule, or two or more group III atoms per molecule), the above computation of the molar ratio is modified as follows. For each multi-atomic precursor gas, one multiplies the molar quantity of the gas by the number of group V or group III atoms per molecule, before summing the quantities together.

In working with MOCVD equipment, the gases are generally fed into the reaction chamber in rates that can be quantified in terms of moles per liter. The above computation for the molar ratio may be carrier out in terms of moles per liter. The liter dimension is common to all gases, and cancels from the ratio calculation.

Since the above embodiment is described only for examples, the present invention is not limited to the above embodiment and various modifications or alterations can be easily made therefrom by those skilled in the art without departing from the scope of the present invention.

The invention claimed is:

1. A semiconductor laser device formed on a semiconductor substrate, the laser device comprising:
   a lower cladding layer having an n type conductivity, formed on a top side of said substrate, said lower cladding layer including a first GRIN-SCH layer;
   an active layer formed on a top side of said lower cladding layer;
   an upper cladding layer having a p type conductivity, formed on a top side of said active layer, said upper cladding layer including a second GRIN-SCH layer;
   a mesa structure formed by said lower cladding layer, said active layer and said upper cladding layer;
   a first current confinement layer having a p type conductivity, formed at a side of the mesa structure and contacting the lower cladding layer; and
   a second current confinement layer having an n type conductivity, formed at a side of the mesa structure and on a top side of and in contact with said first current confinement layer,
   wherein the closest distance between the second current-confinement layer and the active layer has a value in the range from 0.15 µm to 0.6 µm.

2. A semiconductor laser device formed on a semiconductor substrate, the laser device comprising:
   a lower cladding layer having an n type conductivity, formed on a top side of said substrate;
   an active layer formed on a top side of said lower cladding layer;
   an upper cladding layer having a p type conductivity, formed on a top side of said active layer;
   a mesa structure formed by said lower cladding layer, said active layer and said upper cladding layer;
   a first current confinement layer having a p type conductivity, formed at a side of the mesa structure and contacting the lower cladding layer; and
   a second current confinement layer having an n type conductivity, formed at a side of the mesa structure and on a top side of and in contact with said first current confinement layer,
   wherein the closest distance between the second current-confinement layer and the active layer has a value in the range from 0.15 µm to 0.6 µm, and an emission wavelength range is between 1.28 µm and 1.63 µm.

3. A semiconductor laser device formed on a semiconductor substrate, the laser device comprising:
   a lower cladding layer having an n type conductivity, formed on a top side of said substrate;
   an active layer formed on a top side of said lower cladding layer, said active layer having a strained multiple quantum well structure;
   an upper cladding layer having a p type conductivity, formed on a top side of said active layer;
   a mesa structure formed by said lower cladding layer, said active layer and said upper cladding layer;
   a first current confinement layer having a p type conductivity, formed at a side of the mesa structure and contacting the lower cladding layer; and
   a second current confinement layer having an n type conductivity, formed at a side of the mesa structure and on a top side of and in contact with said first current confinement layer,
   wherein the closest distance between the second current-confinement layer and the active layer has a value in the range from 0.15 µm to 0.6 µm.

4. A semiconductor laser device formed on a semiconductor substrate, the laser device comprising:
- a lower cladding layer having an n type conductivity, formed on a top side of said substrate;
- an active layer formed on a top side of said lower cladding layer;
- an upper cladding layer having a p type conductivity, formed on a top side of said active layer;
- a mesa structure formed by said lower cladding layer, said active layer and said upper cladding layer;
- a first current confinement layer having a p type conductivity, formed at a side of the mesa structure and contacting the lower cladding layer;
- a second current confinement layer having an n type conductivity, formed at a side of the mesa structure and on a top side of and in contact with said first current confinement layer;
- a first cleaved surface having a low reflection film; and
- a second cleaved surface having a high reflection film,
- wherein the closest distance between the second current-confinement layer and the active layer has a value in the range from 0.15 µm to 0.6 µm.

5. A semiconductor laser device formed on a semiconductor substrate, the laser device comprising:
- a lower cladding layer having an n type conductivity, formed on a top side of said substrate;
- an active layer formed on a top side of said lower cladding layer;
- an upper cladding layer having a p type conductivity, formed on a top side of said active layer;
- a mesa structure formed by said lower cladding layer, said active layer and said upper cladding layer;
- a first current confinement layer having a p type conductivity, formed at a side of the mesa structure and contacting the lower cladding layer; and
- a second current confinement layer having an n type conductivity, formed at a side of the mesa structure and on a top side of and in contact with said first current confinement layer,
- wherein the closest distance between the second current-confinement layer and the active layer has a value in the range from 0.15 µm to 0.6 µm, and a semiconductor laser device resonator length is 1300 µm or greater.

6. A semiconductor laser device formed on a semiconductor substrate, the laser device comprising:
- a lower cladding layer having an n type conductivity, formed on a top side of said substrate;
- an active layer formed on a top side of said lower cladding layer;
- an upper cladding layer having a p type conductivity, formed on a top side of said active layer;
- a mesa structure formed by said lower cladding layer, said active layer and said upper cladding layer;
- a first current confinement layer having a p type conductivity, formed at a side of the mesa structure and contacting the lower cladding layer; and
- a second current confinement layer having an n type conductivity, formed at a side of the mesa structure and on a top side of and in contact with said first current confinement layer,
- wherein the closest distance between the second current-confinement layer and the active layer has a value in the range from 0.15 µm to 0.6 µm, and a peak output laser power level is 320 mW or larger.

* * * * *